(12) United States Patent
Jeong

(10) Patent No.: US 8,188,506 B2
(45) Date of Patent: May 29, 2012

(54) SEMICONDUCTOR LIGHT EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 226 days.

(21) Appl. No.: 12/571,095

(22) Filed: Sep. 30, 2009

(65) Prior Publication Data

US 2010/0090237 A1    Apr. 15, 2010

(30) Foreign Application Priority Data

Sep. 30, 2008 (KR) .................. 10-2008-0095777
Oct. 27, 2008 (KR) .................. 10-2008-0105256
Nov. 21, 2008 (KR) .................. 10-2008-0116524

(51) Int. Cl.
H01L 29/72 (2006.01)
(52) U.S. Cl. .............. 257/99; 257/773; 257/778
(58) Field of Classification Search .......... 257/99, 257/773, 778
See application file for complete search history.

(56) References Cited

U.S. PATENT DOCUMENTS

| | | | |
|---|---|---|---|
| 6,562,648 B1 | 5/2003 | Wong et al. | |
| 6,975,571 B1 | 12/2005 | Narumi et al. | |
| 7,939,841 B2 * | 5/2011 | Lee et al. | 257/98 |
| 2003/0067953 A1 | 4/2003 | Kim et al. | |
| 2004/0160874 A1 | 8/2004 | Hwang et al. | |
| 2006/0145174 A1 | 7/2006 | Lee et al. | |
| 2007/0012939 A1 | 1/2007 | Hwang et al. | |
| 2007/0278502 A1 * | 12/2007 | Shakuda et al. | 257/88 |
| 2008/0067539 A1 * | 3/2008 | Shakuda | 257/99 |
| 2009/0134416 A1 | 5/2009 | Lee | |
| 2010/0283070 A1 | 11/2010 | Kim et al. | |

FOREIGN PATENT DOCUMENTS

| | | |
|---|---|---|
| EP | 1677366 A2 | 7/2006 |
| EP | 1956663 A1 | 8/2008 |
| JP | 1-123482 A | 5/1989 |
| JP | 07-176830 A | 7/1995 |
| JP | 2002-25060 A | 1/2002 |
| JP | 2004-152473 A | 5/2004 |
| JP | 2005-294772 A | 10/2005 |
| JP | 2006-114103 A | 4/2006 |
| JP | 2007-48412 A | 2/2007 |
| JP | 2008-60132 A | 3/2008 |
| KR | 2003-0030227 A | 4/2003 |
| KR | 10-2006-0032167 A | 4/2006 |
| KR | 10-0597166 B1 | 6/2006 |
| KR | 10-0673640 B1 | 1/2007 |
| KR | 10-0752719 B1 | 8/2007 |
| KR | 10-2008-0058954 A | 6/2008 |
| KR | 10-2008-0075368 A | 8/2008 |
| KR | 10-2008-0079844 A | 9/2008 |
| KR | 10-0887139 B1 | 3/2009 |
| KR | 10-2009-0053233 A | 5/2009 |
| WO | 00/57408 A1 | 9/2000 |

* cited by examiner

*Primary Examiner* — Edward Wojciechowicz
(74) *Attorney, Agent, or Firm* — Birch, Stewart, Kolasch & Birch, LLP

(57) ABSTRACT

A semiconductor light emitting device and corresponding method of manufacture, where the semiconductor light emitting device includes a light emitting structure, a second electrode layer, an insulating layer, and a protrusion. The light emitting structure comprises a second conductive semiconductor layer, an active layer under the second conductive semiconductor layer, and a first conductive semiconductor layer under the active layer. The second electrode layer is formed on the light emitting structure. The insulating layer is formed along the circumference of the top surface of the light emitting structure. The protrusion protrudes from the undersurface of the insulating layer to the upper part of the first conductive semiconductor layer.

20 Claims, 14 Drawing Sheets

SEMICONDUCTOR LIGHT EMITTING DEVICE

CROSS-REFERENCE TO RELATED APPLICATIONS

The present application claims priority under 35 U.S.C. 119 to Korean Patent Application No. 10-2008-0095777 (filed on Sep. 30, 2008), No. 10-2008-0105256 (filed on Oct. 27, 2008), and No. 10-2008-0116524 (filed on Nov. 21, 2008), which are hereby incorporated by reference in their entireties.

BACKGROUND OF THE INVENTION

1. Field of the Invention

The present disclosure relates to a semiconductor light emitting device.

2. Summary of the Invention

Group III-V nitride semiconductors have been variously applied to optical devices comprising blue and green Light Emitting Diodes (LEDs), high-speed switching devices such as a Metal Semiconductor Field Effect Transistor (MOSFET) and a Hetero junction Field Effect Transistors (HEMT), and light sources such as an illumination or display device.

In particular, a light emitting device using a group III nitride semiconductor has a direct transition band gap corresponding to the range between visible rays and ultraviolet rays, realizing highly efficient light emission.

Nitride semiconductors are mainly used for LEDs or Laser Diodes (LD). Studies on ways of improving manufacturing processes and optical efficiency are being carried out.

SUMMARY OF THE INVENTION

Embodiments provide a semiconductor light emitting device comprising an insulating layer at the outer side of a light emitting structure.

Embodiments provide a semiconductor light emitting device comprising an inactive region along the circumference of the light emitting structure.

Embodiments provide a semiconductor light emitting device comprising a protrusion of an insulating layer for dividing an active layer into the active area and the inactive area.

Embodiments provide a semiconductor light emitting device comprising a reflecting layer on the outer wall of an inactive region of a light emitting structure.

Embodiments provide a semiconductor light emitting device comprising a metal loop along an exposed surface of a first conductive semiconductor layer.

An embodiment provides a semiconductor light emitting device that includes a light emitting structure comprising a second conductive semiconductor layer, an active layer under the second conductive semiconductor layer, and a first conductive semiconductor layer under the active layer; a second electrode layer on the light emitting structure; an insulating layer along the circumference of the top surface of the light emitting structure; and a protrusion protruding from the undersurface of the insulating layer to the upper part of the first conductive semiconductor layer.

An embodiment provides a semiconductor light emitting device that includes a light emitting structure comprising a plurality of conductive semiconductor layers and an active layer between the conductive semiconductor layers; a groove exposing a semiconductor layer under the active layer along the circumference of the upper part of the light emitting structure; an insulating layer comprising a protrusion in the groove and disposed along the circumference of the top surface of the light emitting structure; a second electrode layer on the light emitting structure and the insulating layer; and a conductive support member on the second electrode layer.

An embodiment provides a semiconductor light emitting device that includes a light emitting structure comprising an inactive region at the outer side of a plurality of compound semiconductor layers; an insulating layer comprising a protrusion between an active area and the inactive area of the light emitting structure, and disposed along the circumference of the top surface of the light emitting structure; a second electrode layer at the inner side of the top surface of the light emitting structure; and a first electrode under the light emitting structure.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In the description of embodiments, it will be understood that when a layer is referred to as being 'on' or 'under' another layer, the reference about 'on' and 'under' each layer will be made on the basis of drawings. In the description of embodiments, it will be understood that when a layer (or film), region, pattern or structure is referred to as being 'on' or 'under' another layer (or film), region, pad or pattern, the terminology of 'on' and 'under' comprises both the meanings of 'directly' and 'indirectly'. Further, the reference about 'on' and 'under' each layer will be made on the basis of drawings.

<First Embodiment>

Figure 1:
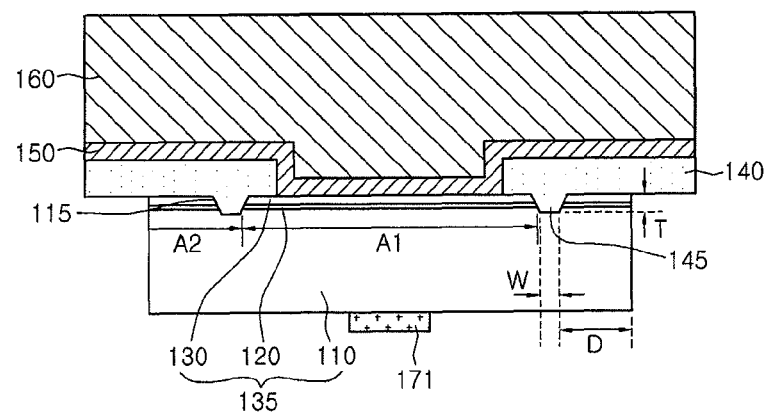
FIG. 1 is a cross-sectional view illustrating a semiconductor light emitting device according to a first embodiment.

FIG. 1 is a cross-sectional view illustrating a semiconductor light emitting device according to a first embodiment.

Referring to FIG. 1, a semiconductor light emitting device 100 comprises a light emitting structure 135, an insulating layer 140, a second electrode layer 150, and a conductive support member 160.

The semiconductor light emitting device 100 may be implemented in light emitting diodes (LEDs) comprising compound semiconductors, for example, compound semiconductors of group III-V elements. LED may be a color LED emitting light such as blue, green, or red, or may be a UV LED, but is not limited thereto.

The light emitting structure 135 comprises a first conductive semiconductor layer 110, an active layer 120, and a second semiconductor layer 130.

The first conductive semiconductor layer 110 may be selected from compound semiconductors of group III-V elements doped with a first conductive dopant, for example, GaN, MN, AlGaN, InGaN, InN, InAlGaN, AlInN, AlGaAs, GaP, GaAs, GaAsP, and AlGaInP. When a first conductive semiconductor is an N-type semiconductor, the first conductive dopant comprises an N-type dopant such as Si, Ge, Sn, Se, and Te. The first conductive semiconductor layer 110 may be formed in a mono- or multi-layer, but is not limited thereto.

A first electrode 171 may be disposed under the first conductive semiconductor layer 110. The first electrode 171 may be formed in a certain pattern, but is not limited thereto. A roughness pattern may be formed on the undersurface of the first conductive semiconductor layer 110 to increase light extraction efficiency.

The active layer 120 is formed on the first conductive semiconductor layer 110 in a single or multiple quantum well structure. The active layer 120 may comprise, for example, InGaN well layer/GaN barrier layer or InGaN well layer/AlGaN barrier layer periodically stacked using a compound semiconductor material of group III-V elements.

A conductive clad layer may be disposed on and/or under the active layer 120. The conductive clad layer may be formed of an AlGaN-based semiconductor.

The second conductive semiconductor layer 130 is formed on the active layer 120. The second conductive semiconductor layer 130 may be selected from the compound semiconductors of group III-V elements doped with a second conductive dopant, which may comprise, for example, GaN, AlN, AlGaN, InGaN, InN, InAlGaN, AlInN, AlGaAs, GaP, GaAs, GaAsP and AlGaInP. When the second conductive semiconductor is a P-type semiconductor, the second conductive dopant comprises a P-type dopant such as Mg and Ze. The second conductive semiconductor layer 130 may be formed in a mono- or multi-layer, but is not limited thereto.

In the light emitting structure 135 may comprise an N-type semiconductor layer or a P-type semiconductor layer on the second conductive semiconductor layer 120. Also, the first conductive semiconductor layer 110 may be implemented in a P-type semiconductor layer, and the second conductive semiconductor layer 130 may be implemented in an N-type semiconductor layer. Thus, the light emitting structure 135 may comprise at least one of an N-P junction, a PN junction, an N-P-N junction, and a P-N-P junction structure.

The insulating layer 140 and the second electrode layer 150 are formed on the second conductive semiconductor layer 130 or the third conductive semiconductor layer. The inner side of the insulating layer 140 is formed on the outer side of the top surface of the second conductive semiconductor layer 130. The outer side of the insulating layer 140 is extended to the outside to be exposed. The insulating layer 140 may be formed in a loop, ring, or frame shape along the circumference of the outer side of the top surface of the second conductive semiconductor layer 130. The insulating layer 140 may be formed in closed loop form.

The insulating layer 140 may be formed of an insulating material, for example, SiO2, $SiO_x$, $SiO_xN_y$, $Si_3N_4$, $Al_2O_3$, or $TiO_2$. The insulating layer 140 may isolate the outer walls of each layer 110, 120 and 130 of the light emitting structure 135 from the second electrode layer 150.

A protrusion 145 is formed under the inner side of the insulating layer 140. The protrusion 145 is formed in a groove 115 in the light emitting structure 135. Thus, an adhesive strength between the insulating layer 140 and the light emitting structure 135 may be improved. The insulating layer 140 may be formed in a thickness of about 0.1 μm to about 2 μm, but is not limited thereto.

The protrusion 145 of the insulating 140 and the groove 115 of the light emitting structure 135 may be formed in a closed loop form having a loop or ring shape.

The protrusion 145 of the insulating 140 is spaced from the outer wall of the light emitting structure 135 by a predetermined distance D. The distance D may range from about 1 μm to about 5 μm, and vary with the size of the light emitting structure 135.

The width W of the protrusion 145, the width of the lower end of the protrusion 145 may be from about 1 μm to about 10 μm. The critical criterion of the width W is no electrical interference between active layers of two regions A1 and A2. The protrusion 145 may comprise an unevenness pattern, a zigzag pattern, or a roughness surface.

Here, the cross-sectional shape of the protrusion 145 may be semi-circular, semi-elliptical, horned, cylindrical, or polygonal (for example, square, diamond, and trapezoid), but is not limited thereto.

The depth of the groove 115 of the light emitting structure 135 may range from the second conductive semiconductor layer 130 to an upper part of the first conductive semiconductor layer 110. The protrusion 145 of the insulating layer 140 electrically isolates the semiconductor layers 130 and 120 of the first region A1 from the semiconductor layers 130 and 120 of the second region A2.

The second conductive semiconductor layer 130 and the active layer 120 of the second region A2 are a non-light emitting region (or inactive area) because being electrically isolated by the protrusion 145 of the insulating layer 140 having a closed-loop shape. That is, the active layer 120 of the second region A2 is not activated even though the semiconductor light emitting device 100 is powered on.

The thickness T of the protrusion 145 of the insulating layer 140 may exceed the thickness of the second conductive semiconductor layer 130 and the active layer 120, or may be extended to the upper part of the first conductive semiconductor layer 110. The protrusion 145 of the insulating layer 140 may be formed singly or multi-folded.

The second electrode layer 150 may be formed on the inner side of the surface of the second conductive semiconductor layer 130. The outer side of the second electrode layer 150 may be formed on the insulating layer 140. The second electrode layer 150 is disposed on the first conductive semiconductor layer 130 of the first region A1.

The second electrode layer 150 may be formed of Ag, Ni, Al, Rh, Pd, Ir, Ru, Mg, Zn, Pt, Au, Hf, or a combination thereof. Also, an ohmic contact layer (not shown) may be disposed between the second electrode layer 150 and the second conductive semiconductor layer 130. The ohmic contact layer may be formed in a layer- or multi-pattern. The ohmic contact layer may comprise at least one of an Indium Tin Oxide (ITO), an Indium Zinc Oxide (IZO), an Indium Zinc Tin Oxide (IZTO), an Indium Aluminum Zinc Oxide (IAZO), an Indium Gallium Zinc Oxide (IGZO), an Indium Gallium Tin Oxide (IGTO), an Aluminum Zinc Oxide (AZO), an Antimony Tin Oxide (ATO), a Gallium Zinc Oxide (GZO), $IrO_x$, $RuO_x$, $RuO_x$/ITO, Ni/$IrO_x$/Au, and Ni/$IrO_x$/Au/ITO.

The conductive support member 160 is disposed on the second electrode layer 150. The conductive support member 160, which is a base substrate, may be formed of Cu, Au, Ni, Mo, Cu—W, and a carrier wafer (for example, Si, Ge, GaAs, ZnO, and Sic). The conductive support member 160 may be formed through an electrolytic plating method or in a sheet shape, but is not limited thereto.

In the light emitting structure 135, the active layer 120 of the first region A1 is activated to emit light, but the second region A2 is not activated because the second region A2 is electrically isolated from the first region A1. Because the second region A2, the outer region of the light emitting structure 135, is electrically opened, a short circuit due to humidity penetrating into the outer wall of the light emitting structure 135 can be prevented, thereby protecting the first region A1.

Also, it is not necessary to form a separate insulating layer on the entire outer wall of the light emitting structure 135.

FIGS. 2 to 12 are views illustrating a process of manufacturing a semiconductor light emitting according to the first embodiment.

Figure 2:
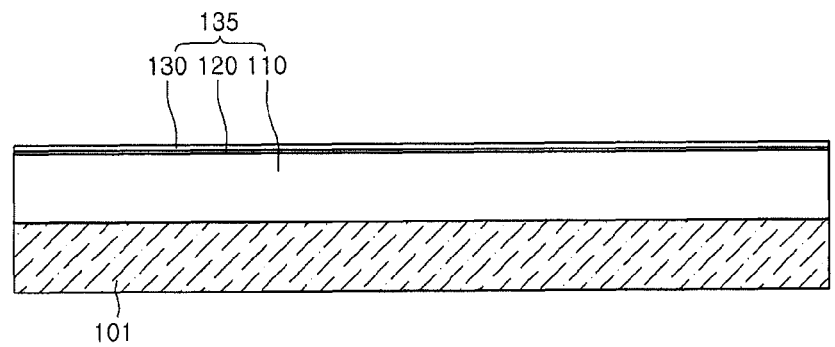
FIGS. 2 to 12 are views illustrating a process of manufacturing a semiconductor light emitting in FIG. 1.
Figure 3:
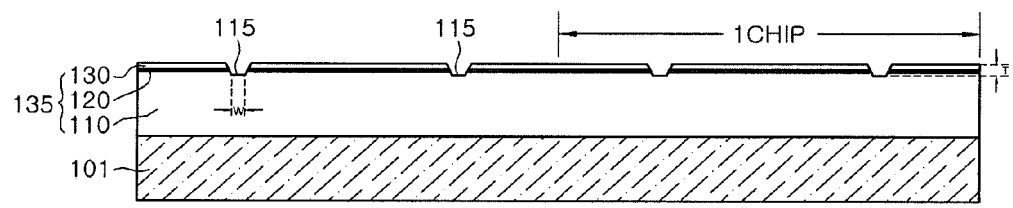

Referring to FIGS. 2 and 3, the substrate 101 is loaded to growth equipment. A compound semiconductor of group II to VI elements may be formed on the substrate 101 in a layer or pattern.

The growth equipment may be formed by an electron beam evaporator, or a dual-type thermal evaporator, but is not limited thereto. The growth may be performed through Physical Vapor Deposition (PVD), Chemical Vapor Deposition (CVD), Plasma Laser Deposition (PLD), sputtering, and Metal Organic Chemical Vapor Deposition, but is not limited thereto.

The substrate 101 may be selected from a group comprising a sapphire substrate ($Al_2O_3$), GaN, SiC, ZnO, Si, GaP, InP, $Ga_2O_3$, GaAs, and a conductive substrate. An unevenness pattern may be formed on the substrate 101. A layer or pattern of compound semiconductor of group II-VI elements, for example, at lease one of a ZnO layer (not shown), a buffer layer (not shown), and an undoped semiconductor layer (not shown) may be formed on the substrate 101.

The buffer layer (not shown) or the undoped semiconductor layer (not shown) may be formed using a compound semiconductor of group III-V elements. The buffer layer (not shown) may reduce a difference of a lattice constant between the substrate 101 and the compound semiconductor. The undoped semiconductor layer (not shown) may be formed of an undoped GaN-based semiconductor.

A first conductive semiconductor layer 110 is formed on the substrate 101. An active layer 120 is formed on the first conductive semiconductor layer 110. A second conductive semiconductor layer 130 is formed on the active layer 120.

The first conductive semiconductor layer 110 may be selected from compound semiconductors of group III-V elements doped with a first conductive dopant, for example, GaN, AlN, AlGaN, InGaN, InN, InAlGaN, AlInN, AlGaAs, GaP, GaAs, GaAsP, and AlGaInP. When the first conductive semiconductor is an N-type semiconductor, the first conductive dopant comprises an N-type dopant such as Si, Ge, Sn, Se, and Te. The first conductive semiconductor layer 110 may be formed in a mono- or multi-layer, but is not limited thereto.

The active layer 120 is formed on the first conductive semiconductor layer 110. The active layer 120 may be formed in a single or multiple quantum well structure. The active layer 120 may comprise, for example, InGaN well layer/GaN barrier layer or InGaN well layer/AlGaN barrier layer periodically stacked using the compound semiconductor material of group III-V elements.

The conductive clad layer may be formed on and/or under the active layer 120. The conductive clad layer may be formed of an AlGaN-based semiconductor.

The second conductive semiconductor layer 130 is formed on the active layer 120. The second conductive semiconductor layer 130 may be selected from the compound semiconductors of group III-V elements doped with a second conductive dopant, which may comprise, for example, GaN, AlN, AlGaN, InGaN, InN, InAlGaN, AlInN, AlGaAs, GaP, GaAs, GaAsP and AlGaInP. When the second conductive semiconductor is a P-type semiconductor, the second conductive dopant comprises a P-type dopant such as Mg and Ze. The second conductive semiconductor layer 130 may be formed in a mono- or multi-layer, but is not limited thereto.

The first conductive semiconductor layer 110, the active layer 120, and the second conductive semiconductor layer 130 may be defined as a light emitting structure. A third conductive semiconductor layer, for example, an N-type semiconductor layer or a P-type semiconductor layer may be formed on the second conductive semiconductor layer 130. Thus, the light emitting structure 135 may comprise at least one of an N-P junction, a PN junction, an N-P-N junction and a P-N-P junction structure.

A groove 115 having a certain depth is formed in the inner side of an individual chip boundary region. The groove 115 may be formed in a closed loop having a ring or loop shape along the circumference of the inner side of the individual chip using a mask pattern. The depth T of the groove 115 is extended from the second conductive semiconductor layer 130 to expose the upper part of the first conductive semiconductor layer 110.

Here, the cross-sectional shape of the groove 115 may be semi-circular, semi-elliptical, horned, cylindrical, or polygonal (for example, square, diamond, and trapezoid), but is not limited thereto. A plurality of grooves 115 may be formed. The groove 115 may be formed with an unevenness pattern, a zigzag pattern, or a roughness pattern, which may enhance an adhesive strength between layers.

The groove 115 may be formed through a wet or dry etching process, but is not limited thereto.

Figure 4:
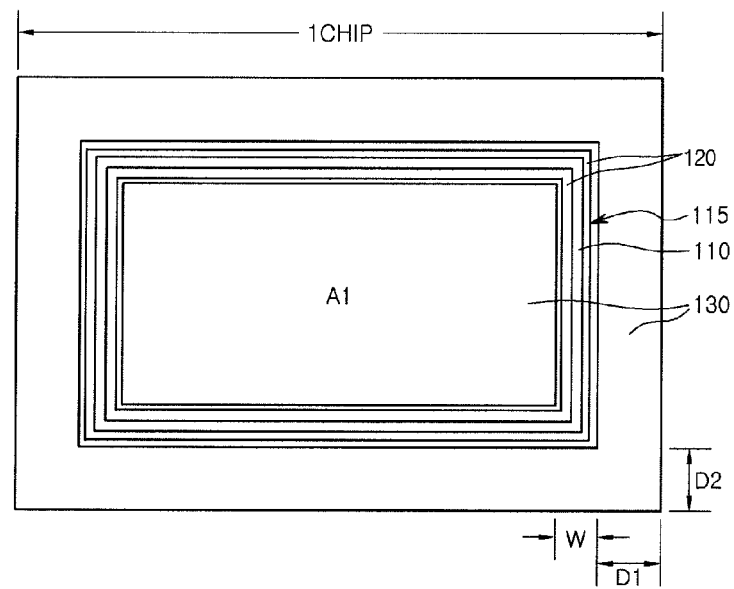

FIG. 4 is a view illustrating the exemplary groove in FIG. 3.

Referring to FIGS. 3 and 4, the groove 115 is formed in a rectangular loop pattern in the upper part of the second conductive semiconductor layer 130. The first conductive semiconductor layer 110 is exposed at the center of the loop.

The groove 115 is spaced from a first chip boundary by a first distance D1, and spaced from a second chip boundary by a second distance D2. The first distance D1 and the second distance D2 are identical to or different from each other. The width W of the bottom of the groove 115, which exposes the first conductive semiconductor layer 110, is formed in about 1 µm to about 10 µm.

The shape of the groove 115 may be circular, or polygonal (such as a triangle or a square,) but is not limited thereto. The groove 115 may be formed in a zigzag pattern. The groove 115 may be formed singly or multi-folded to improve an adhesive strength between layers.

Figure 5:
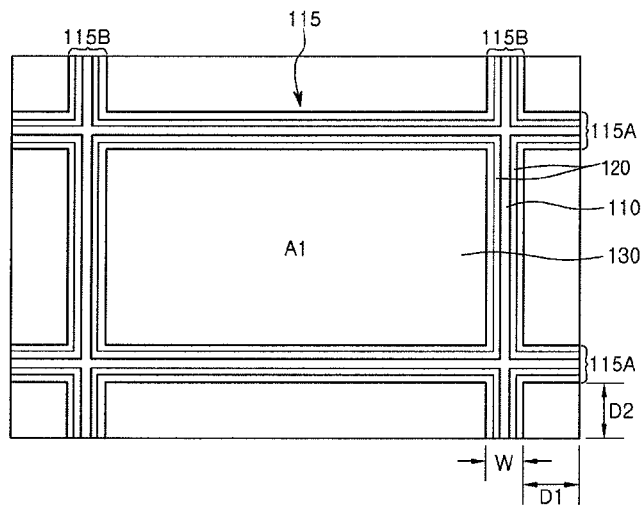

FIG. 5 is a view illustrating another exemplary groove in FIG. 3.

Referring to FIG. 5, grooves 115A and 115B are formed in a chip boundary region parallel thereto and divide the chip boundary region into a first region A1 and a second region A2.

As described in FIGS. 4 and 5, the shape of the groove 115 may vary with an etching.

Figure 6:
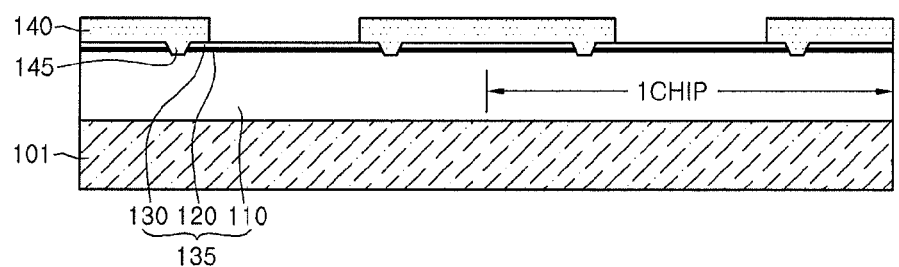
Figure 7:
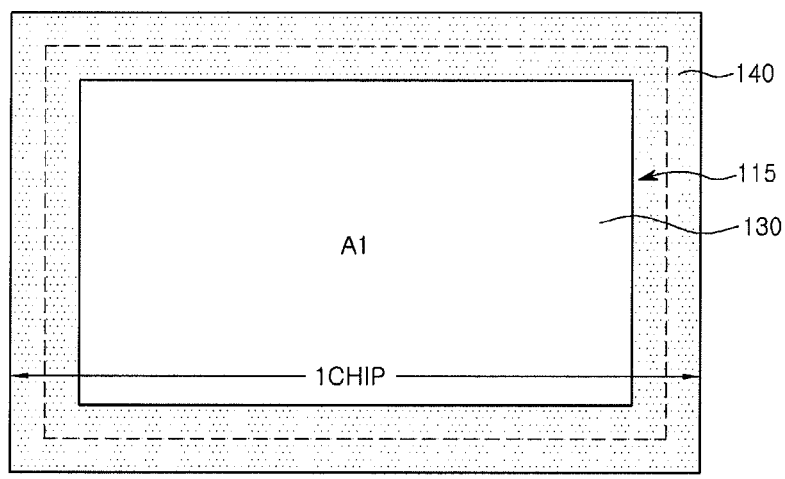

Referring to FIGS. 6 and 7, an insulating layer 140 is formed on the chip. The insulating layer 140 is formed on the surface of the second conductive semiconductor layer 130. The insulating layer 140 may be formed in a desired region using a mask pattern.

A protrusion 145 of the insulating layer 140 is formed in the groove 115.

The protrusion 145 of the insulating layer 140 divides the second conductive semiconductor layer 130 and the active layer 120 of the first region A1 and the second region A2.

The first region A1 becomes an inner region or an active region of the light emitting structure 135 by the protrusion 145, and the second region A2 becomes an outer region or an inactive region.

Figure 8:
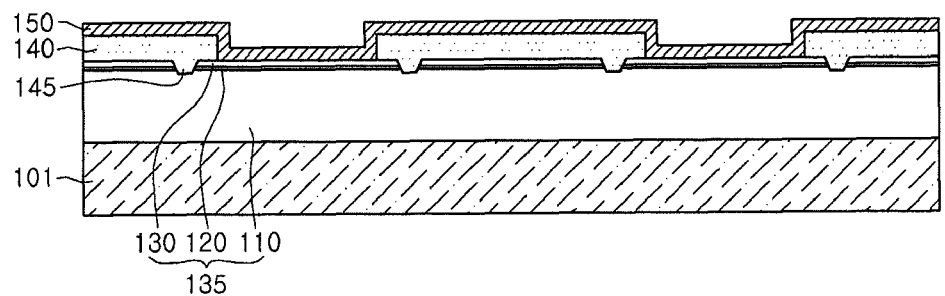
Figure 9:
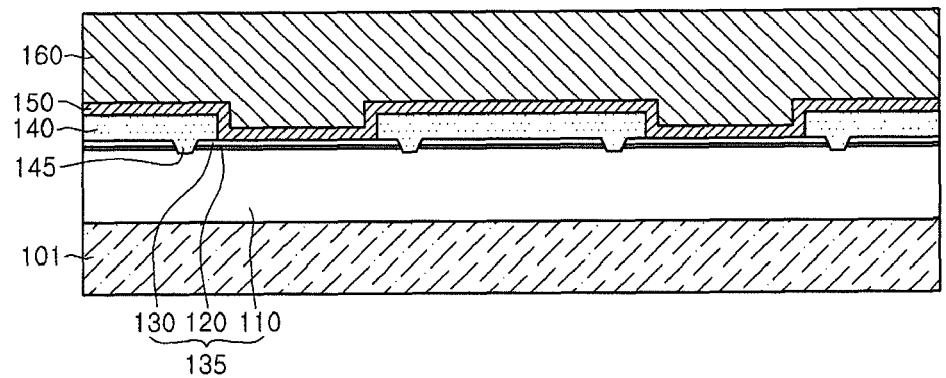

Referring to FIGS. 8 and 9, a second electrode layer 150 is formed on the second conductive semiconductor layer 130. The second electrode layer 150 may also be formed on the insulating layer 140.

The second electrode layer 150 may be formed of a material comprising Ag, Ni, Al, Rh, Pd, Ir, Ru, Mg, Zn, Pt, Au, Hf, and a combination thereof.

The second electrode layer 150 is used as a path for supplying a power of a second polarity.

Here, an ohmic contact layer (not shown) may be formed between the second electrode layer 150 and the second conductive semiconductor layer 130. The ohmic contact layer may comprise at least one of an Indium Tin Oxide (ITO), an Indium Zinc Oxide (IZO), an Indium Zinc Tin Oxide (IZTO), an Indium Aluminum Zinc Oxide (IAZO), an Indium Gallium Zinc Oxide (IGZO), an Indium Gallium Tin Oxide (IGTO), an Aluminum Zinc Oxide (AZO), an Antimony Tin Oxide (ATO), a Gallium Zinc Oxide (GZO), $IrO_x$, $RuO_x$, $RuO_x$/ITO, Ni/$IrO_x$/Au, and Ni/$IrO_x$/Au/ITO.

A conductive support member 160 is formed on the second electrode layer 150. The conductive support member 160, which serves as a base substrate, may be formed of Cu, Au, Ni, Mo, Cu—W, and a carrier wafer (for example, Si, Ge, GaAs, ZnO, and Sic). The conductive support member 160 may be formed through an electrolytic plating method or in a sheet shape, but is not limited thereto.

The second electrode layer 150 and the conductive support member 160 may be formed of, for example, a reflecting electrode support member in a mono-layer.

Figure 10:
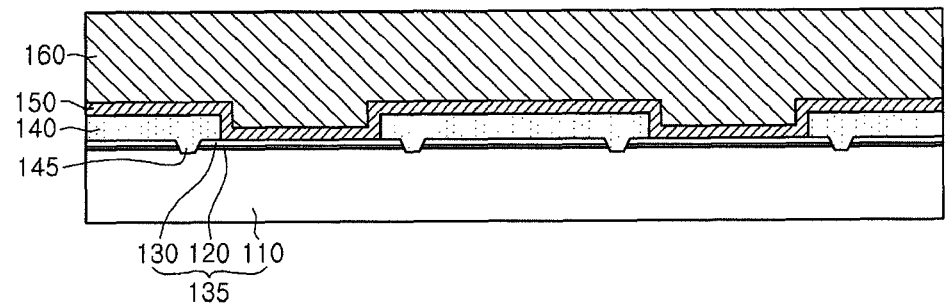

Referring to FIGS. 9 and 10, the substrate 101 is removed after the conductive support member 160 is positioned on the base. The substrate 101 may be removed through a Laser Lift Off (LLO) process, which is a method of separating the substrate 101 by irradiating a laser having a predetermined wavelength on the substrate 101. Here, when other semiconductor layer (for example, a buffer layer) is disposed between the substrate 101 and the first conductive semiconductor layer 110, the substrate 101 may be separated by removing the buffer layer using a wet etchant.

The surface of the first conductive semiconductor layer 110, from which the substrate 101 has been removed, may be polished by an Inductively Coupled Plasma/Reactive Ion Etching process.

Figure 11:
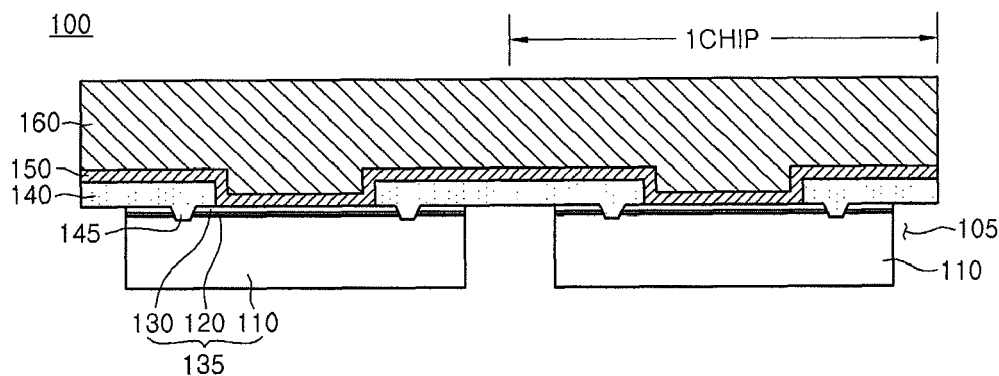
Figure 12:
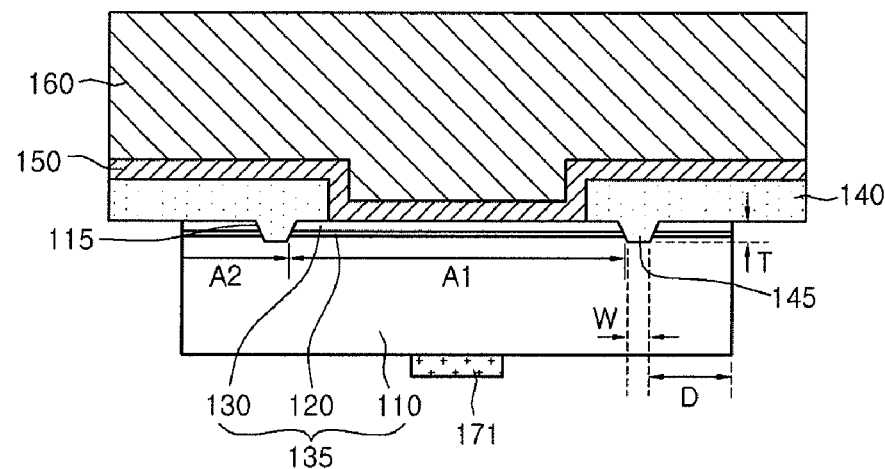

Referring to FIGS. 11 and 12, the chip and the chip boundary region (i.e., channel region) of the light emitting structure 135 may be removed through a mesa etching. A mesa etching region 105 is removed to expose the insulating layer 140 at the chip boundary region, but is not limited thereto.

Figure 13:
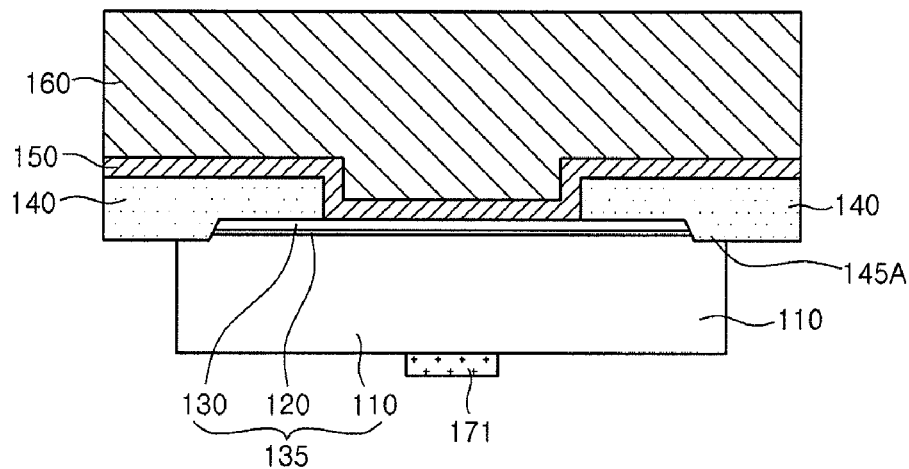
FIG. 13 is a cross-sectional view illustrating a semiconductor light emitting device according to a second embodiment.

Referring to FIGS. 12 and 13, the semiconductor light emitting device 100 is divided into individual chips along the chip boundary region 105. In this case, the semiconductor light emitting device 100 may be divided by a laser or a breaking process.

A first electrode 171 is formed under the first conductive semiconductor layer 110 in a certain pattern. A roughness (not shown) may also be formed on the undersurface of the first conductive semiconductor layer 110.

In the semiconductor light emitting device 100, light is emitted from the active layer 120 of the first region A1 because the second conductive semiconductor layer 130 and the active layer 120 of the first region A1 are electrically isolated from the second conductive semiconductor layer 130 and the active layer 120 of the second region A2.

Also, although the outer wall of the light emitting structure 135 is exposed to humidity, a short occurrence can be prevented without affecting the first region A1. The protrusion 145 of the insulating layer 140 can protect an LED from humidity.

Because a laser is transmitted through the insulating layer 140 upon scribing of the laser, fragmentation of metallic material due to the laser is prevented. Accordingly, a short circuit between layers on the side wall of the light emitting structure 135 can be prevented.

<Second Embodiment>

FIG. 13 is a cross-sectional view illustrating a semiconductor light emitting device according to a second embodiment. Hereinafter, repeated descriptions of parts identical to those described in the first embodiment will be omitted.

Referring to FIG. 13, a semiconductor light emitting device 100A comprise an insulating layer 140 between a second conductive semiconductor layer 130 and a second electrode layer 150. The insulating layer 140 is formed around the outer side of the second conductive semiconductor layer 130.

The insulating layer 140 is formed of an insulating material, and comprises a protrusion 145A under the outer side thereof. The insulating material may be formed of $SiO_2$, $SiO_x$, $SiO_xN_y$, $Si_3N_4$, $Al_2O_3$, or $TiO_2$, but is not limited thereto.

The protrusion 145A of the insulating layer 140 is formed along the circumference of a light emitting structure 135, and has a thickness of extending to the upper part of a first conductive semiconductor layer 110. Thus, the protrusion 145A of the insulating layer 140 isolates the outer wall of the light emitting structure 135 from the second electrode layer 150.

Although the outer wall of the light emitting structure 135 is exposed to humidity, a light emitting region can be prevented. An active region of the light emitting structure 135 can be more efficiently prevented than that in the first embodiment by the protrusion 145A of the insulating layer 140.

<Third Embodiment>

Figure 14:
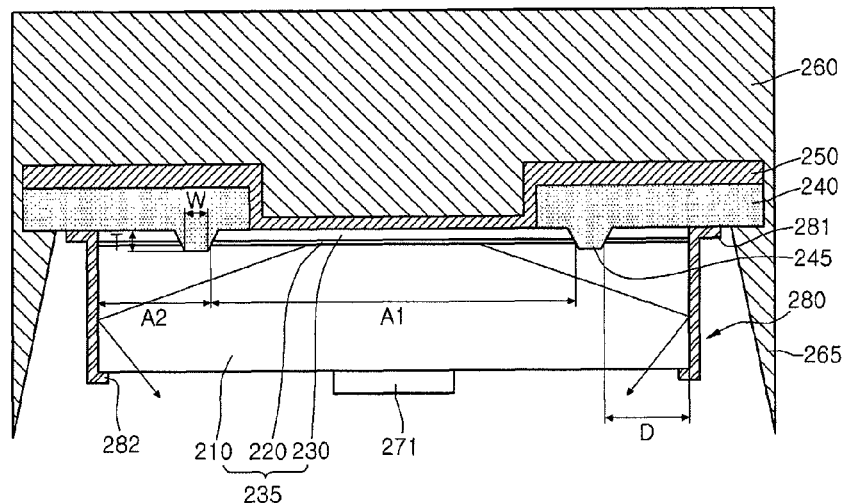
FIG. 14 is a cross-sectional view illustrating a semiconductor light emitting device according to a third embodiment.

FIG. 14 is a cross-sectional view illustrating a semiconductor light emitting device according to a third embodiment.

Referring to FIG. 14, a semiconductor light emitting device 200 comprises a light emitting structure 235, an insulating layer 240, a second electrode layer 250, a conductive support member 260, and a reflecting layer 280.

The light emitting structure 235 comprises a first conductive semiconductor layer 210, an active layer 220, and a second conductive semiconductor layer 230. In the light emitting structure 235, an N-type semiconductor layer or a P-type semiconductor layer may be disposed on the second conductive semiconductor layer 230. The first embodiment will be referred with respect to the light emitting structure 235.

A first electrode 271 may be formed on the undersurface of the first conductive semiconductor layer 210 in a certain pattern.

The insulating layer 240 and the second electrode layer 250 are formed on the insulating layer 240 and the second electrode layer 250.

The insulating layer 240 is formed on the outer side of the top surface of the second conductive semiconductor layer 230. The second electrode layer 250 is formed on the inner side of the top surface of the second conductive semiconductor layer 230. The second electrode layer 250 is extended to the surface of the insulating layer 240.

The insulating layer 240 may be formed of an insulating material comprising, for example, SiO2, $SiO_x$, $SiO_xN_y$, $Si_3N_4$, $Al_2O_3$, and $TiO_2$.

The insulating layer 240 can improve an adhesive strength the second conductive semiconductor layer 230 and the second electrode layer 250. The thickness of the insulating layer 240 may range from about 0.1 μm to about μm, but is not limited thereto.

An protrusion 245 is formed under the inner side of the insulating layer 240. The protrusion 245 may be formed between a first region A1 and a second region A2 in the light emitting structure 235. The protrusion 245 may be formed in a closed loop having a ring or loop shape, thereby maintaining the second region A2 inactive or in an electrically state.

Hereinafter, detailed descriptions of the distance D from the reflecting layer 280 and the thickness T of the protrusion 245 will be omitted by referring to the first embodiment.

One or more protrusions 245 may be formed in a zigzag pattern, but is not limited thereto.

The width of the protrusion 245, the width of the lower end of the protrusion 245 may range from about 1 μm to about 10 μm. The critical criterion of the width W is a minimum interval between active layers of two regions A1 and A2, having no electrical interference therebetween.

Hereinafter, detailed descriptions of the second electrode layer 250 and the conductive support member 260 will be omitted by referring to the first embodiment.

Light is emitted from the first region A1 of the light emitting structure 235. The second region A2 is not activated because being electrically opened. Because the outer region is electrically opened, the first region A1 can be protected from a short circuit due to humidity. Moreover, a separate insulating layer need not be formed on the outer wall of the light emitting structure 235.

An external protrusion 265 is formed under the outer side of the conductive support member 260 through a laser scribing process. The external protrusion 265 may be formed around the circumference of the outer wall of the light emitting structure 235, and formed of a material such as Cu that forms the conductive support member 260.

The external protrusion 265 of the conductive support member 260 may absorb light emitted from the light emitting structure 235 to the side wall. Accordingly, the reflecting layer 280 is formed on the side wall of the light emitting structure 235.

The reflecting layer 280 may comprise a highly reflecting material, for example, Al, Ag, and the like. One end 282 of the reflecting layer 280 is extended to the outer side of the undersurface of the first conductive semiconductor layer 210, and the other end 281 is extended to the undersurface of the insulating layer 240. Thus, by covering the entire outer wall of the light emitting structure 235, light traveling toward the side wall of the light emitting structure 235 may be reflected by the reflecting layer 280, thereby improving the external quantum efficiency.

The reflecting layer 280 may be formed on the side wall of the light emitting structure 235, or may be formed inside the external protrusion 265 of the conductive support member 260, but is not limited to thereto.

FIGS. 15 to 22 are views illustrating an exemplary process of manufacturing the semiconductor light emitting device in FIG. 14.

Hereinafter, repeated descriptions will be omitted by referring to the first embodiment.

Figure 15:
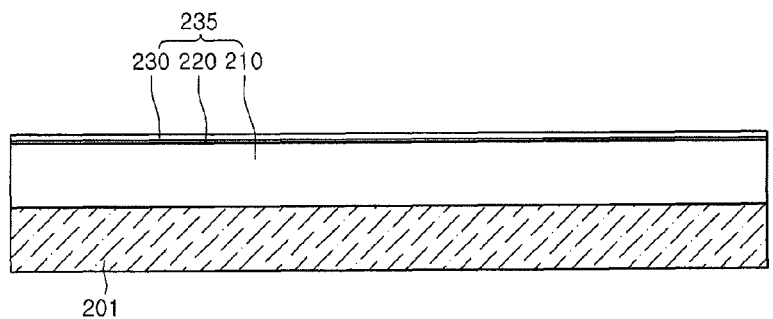
FIGS. 15 to 22 are views illustrating a process of manufacturing a semiconductor light emitting device in FIG. 14.

Referring to FIG. 15, a first conductive semiconductor layer 210 is formed on the substrate 201. An active layer 220 is formed on the first conductive semiconductor layer 210. A second conductive semiconductor layer 230 is formed on the active layer 220.

The first conductive semiconductor layer 210, the active layer 220, and the second conductive semiconductor layer 230 may be defined as a light emitting structure 235. The light emitting structure 235 may comprise at least one of an N-P junction, a P-N junction, an N-P-N junction, and a P-N-P junction structures.

Figure 16:
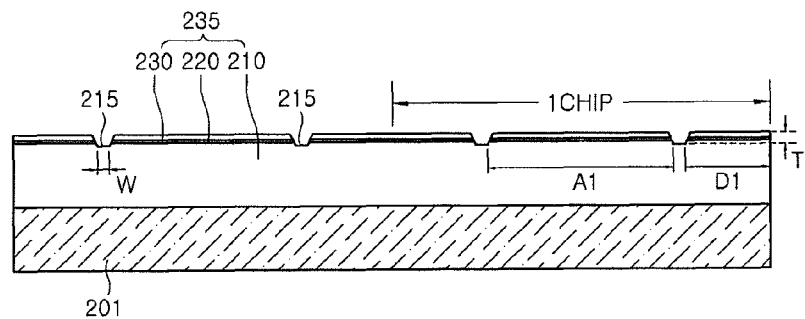

Referring to FIG. 16, a groove 215 having a certain depth is formed in a boundary region of an individual chip. The groove 215 is extended from the second conductive semiconductor layer 230 to the upper part of the first conductive semiconductor layer 210.

As described in FIGS. 4 and 5, the groove 215 may be formed in a closed loop having a loop or ring shape, along the circumference of the top surface of the second conductive semiconductor layer 210. The groove 215 is formed to have such a depth T as to expose a portion of the first conductive semiconductor layer 210.

Here, the loop shape of the groove 215 may be modified. The cross-sectional shape of the groove 215 may be semi-circular, semi-elliptical, inverted-horned, cylindrical, or polygonal (for example, square, diamond, and trapezoid), but is not limited thereto. One or more grooves 215 may be formed in a straight line or a zigzag pattern, but is not limited thereto.

The groove 215 may be formed using a mask pattern through a wet and/or dry etching process, but is not limited thereto.

The groove 215 is spaced from the boundary of each chip by a certain distance D1, for example, from about 1 μm to about 5 μm. The width W of the bottom of the groove 215 may range from about 1 μm to about 10 μm, where the first conductive semiconductor is exposed.

The shape of the groove 215 may be circular, elliptical, polygonal such as triangle and square, but is not limited thereto. The inner region A1 of the groove 215 may be a substantial light emitting region.

Figure 17:
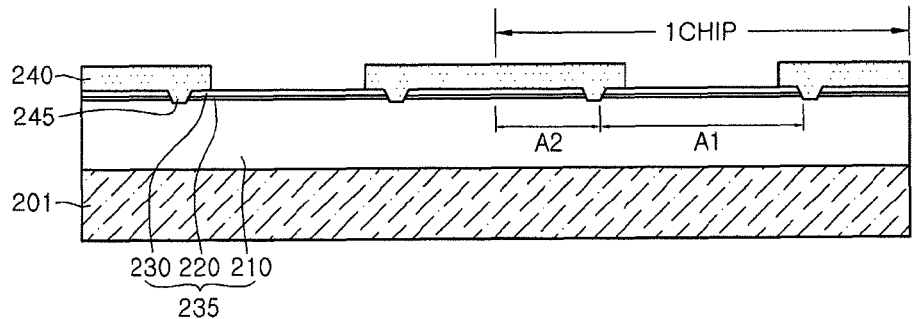

Referring to FIG. 17, an insulating 240 is formed on the outer side of the top surface of the second conductive semiconductor layer 230. In this case, a protrusion 245 of the insulating layer 240 is formed in the groove 215.

The protrusion 245 of the insulating layer 240 electrically isolates the second conductive semiconductor layer 230 and the active layer 220 of the first region A1 from those of the second region A1.

By the protrusion 245, the first region A1 235 becomes an active region of the light emitting structure, and the second region A2 becomes an inactive region of the light emitting structure 235.

Figure 18:
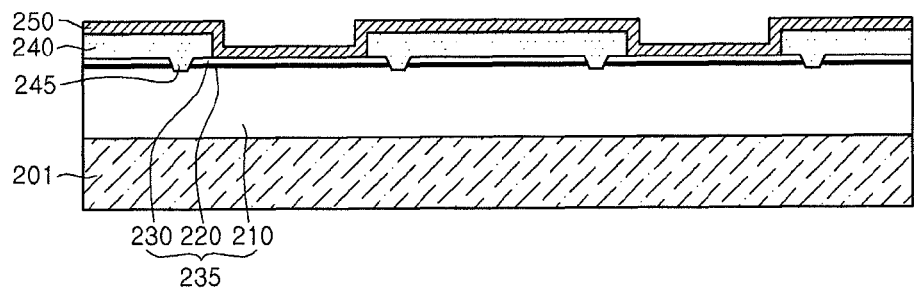
Figure 19:
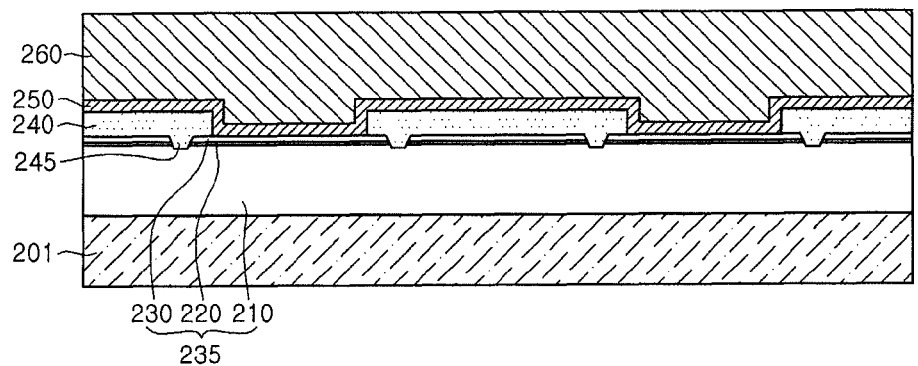

Referring to FIGS. 18 and 19, a second electrode layer 250 is formed on the second conductive semiconductor layer 230 and the insulating layer 240. A conductive support member 260 is formed on the second electrode layer 250. Hereinafter, detailed descriptions of the second electrode layer 250 and the conductive support member 260 will be omitted.

An ohmic contact layer may be formed between the second electrode layer 250 and the second conductive semiconductor layer 230 in a layer or multi-pattern, but is not limited thereto.

Referring again to FIGS. 18 and 19, the substrate 201 is removed after the conductive support member 260 is positioned on the base. The substrate 201 may be removed by a physical and/or chemical method, for example, an LLO process or a wet etching method, but is not limited thereto.

Figure 20:
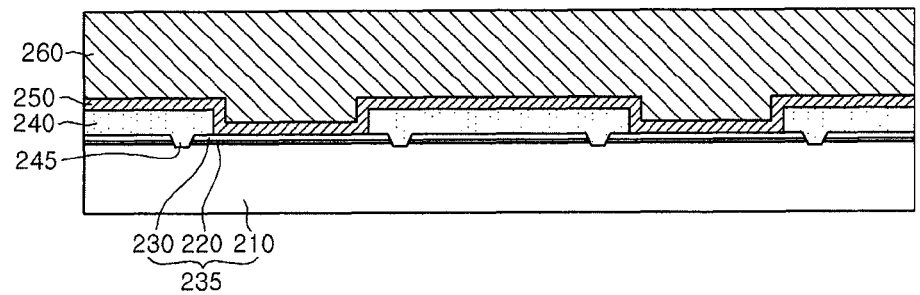

Referring to FIGS. 19 and 20, the chip and the chip boundary region (i.e., channel region) of the light emitting structure 235 may be removed through a mesa etching (example, using ICP equipment). A mesa etching region 205 is removed to expose the insulating layer 240 at the chip boundary region, but is not limited thereto.

When the chip boundary region 205, a reflecting layer 280 is formed on the outer wall of the light emitting structure 235. The reflecting layer 280 may be on at least one of the side walls of the light emitting structure 235. Here, because the semiconductor layers 210, 220 and 230 are electrically opened at the outer wall of the light emitting structure 235, a short circuit between layers does not need to be considered. Accordingly, the reflecting layer 280 reflects light travelling toward the side wall of the light emitting structure 235.

One end 282 of the reflecting layer 280 is extended to the outer side of the undersurface of the first conductive semiconductor layer 210, and the other end 281 is extended to the undersurface of the insulating layer 240, thereby enhancing an adhesive strength between layers.

Figure 21:
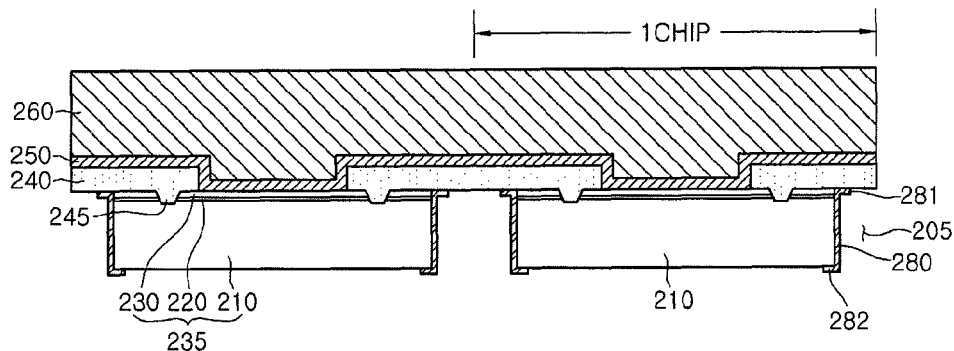
Figure 22:
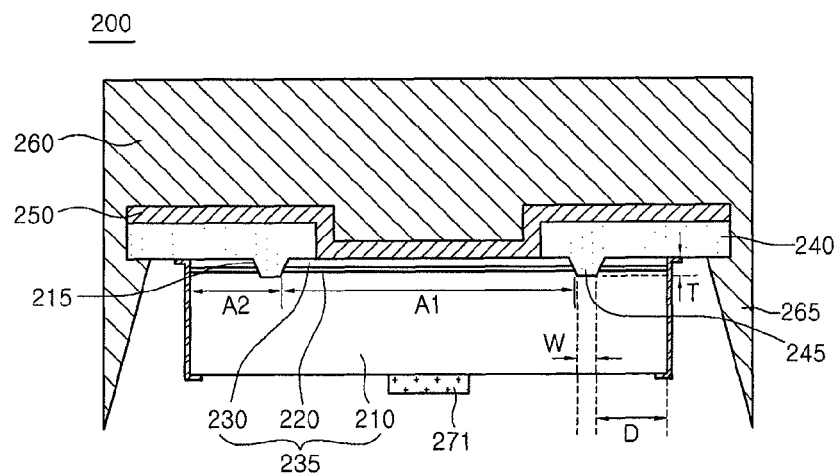

Referring to FIG. 21, the semiconductor light emitting device 200 is divided into individual chips along the chip boundary region 205. In this case, the semiconductor light emitting device 200 may be divided by a laser or a breaking process. When using the laser in the chip division, the outer side of the conductive support member 260 where the laser is concentrated may be downwardly protruded to form a protrusion 265 having a certain height. The protrusion 265 may be formed of a material such as Cu that forms the conductive support member 260, thereby absorbing light. The reflecting layer 280 reflects light travelling from the light emitting structure 235 to the outer wall. Accordingly, the light may be prevented from being absorbed by the protrusion 265 of the conductive support member 260.

The shape and the size of the protrusion 265 of the conductive support member 260 may be varied according to embodiments. The reflecting layer 280 may not be formed on the side wall of the light emitting structure 235, but may be formed on the inner side of the protrusion 265.

A first electrode 271 may be formed on the undersurface of the first conductive semiconductor layer 210. The first electrode 271 may be formed in a certain pattern.

In the semiconductor light emitting device 200, the second conductive semiconductor layer 230 and the active layer 220 of the first region A1 is electrically isolated from the second conductive semiconductor layer 230 and the active layer 220 of the second region A2. Accordingly, although the outer wall of the light emitting structure 235 is exposed to humidity, a short occurrence can be prevented without affecting the first region A1. The protrusion 145 of the insulating layer 140 can protect an LED from humidity.

Light emitting to the outer wall of the light emitting structure 235 is reflected by the reflecting layer 280, thereby improving external quantum efficiency. Because the outer wall of the light emitting structure 235 is an inactive region, the external quantum efficiency can be improved by a reflecting layer having an unevenness surface, which may be formed through a mesa etching.

<Fourth Embodiment>

Figure 23:
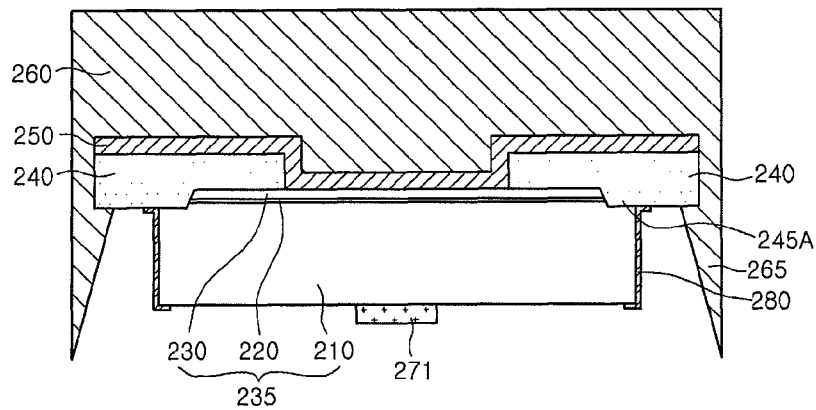
FIG. 23 is a cross-sectional view illustrating a semiconductor light emitting device according to a fourth embodiment.

FIG. 23 is a cross-sectional view illustrating a semiconductor light emitting device according to a fourth embodiment. Hereinafter, repeated descriptions of parts identical to those of the third embodiment will be omitted.

Referring to FIG. 23, a semiconductor light emitting device 200A comprises an insulating layer 240 formed between a light emitting structure 235 and a second electrode layer 250.

The insulating layer 240 is formed of an insulating material, and comprise a protrusion 245A downwardly formed on the outer side thereof. The protrusion 245A is formed at the outer end of a second conductive semiconductor layer 230, an active layer 230, and a first conductive semiconductor layer 210. Because the protrusion 245A of the insulating layer 240 is formed on the side wall and the outer surface of the light emitting structure 235, a short circuit between the semiconductors 110, 120 and 130 due to humidity can be prevented.

<Fifth Embodiment>

Figure 24:
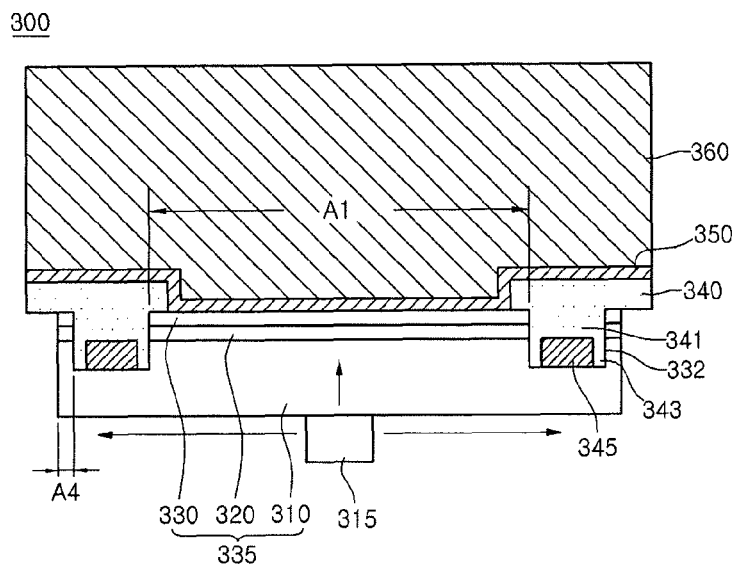
FIG. 24 is a cross-sectional view illustrating a semiconductor light emitting device according to a fifth embodiment.

FIG. 24 is a cross-sectional view illustrating a semiconductor light emitting device according to a fifth embodiment. Hereinafter, repeated descriptions of parts identical to those described in the first embodiment will be omitted.

Referring to FIG. 24, a semiconductor light emitting device 300 comprises a first conductive semiconductor layer 310, an active layer 320, a second conductive semiconductor layer 330, an insulating layer 340, a metal loop 345, a second electrode layer 350, a conductive support member 360, and a first electrode 315.

The active layer 320 is formed on the first conductive semiconductor layer 310. The second conductive semiconductor layer 330 may be formed on the active layer 320.

The first conductive semiconductor layer 310, the active layer 320, and the second conductive semiconductor layer 330 may comprise at least one of compound semiconductors of group III-V elements, for example, GaN, InN, AlN, InGaN, AlGaN, InAlGaN, AlInN, AlGaAs, GaP, GaAs, GaAsP, and AlGaInP.

A first electrode 315 having a certain pattern is formed on the undersurface of the first conductive semiconductor layer 315.

The active layer 320 may be formed in a single or multiple quantum well structure. A clad layer may be formed on the surface and/or the undersurface of the active layer 320.

The first conductive semiconductor layer 310, the active layer 320, and the second conductive semiconductor layer 330 may be defined as a light emitting structure 335. The light emitting structure 335 may comprise at least one of an N-P junction, a P-N junction, an N-P-N junction, and P-N-P junction structures.

The second electrode layer 350 is formed on the inner side of the top surface of the second conductive semiconductor layer 330 or a third conductive semiconductor. The features and material of the second electrode layer 350 will be those described in the first embodiment. The second electrode layer 350 may be formed on the insulating layer 340.

An ohmic contact layer may be formed between the second electrode layer 350 and the second conductive semiconductor layer 330 or the third conductive semiconductor layer. The ohmic contact layer may be formed in a layer or multi-pattern using a material such as ITO described in the first embodiment.

The insulating layer 340 is formed on the outer side of the top surface of the light emitting structure 335. The inner side of the insulating layer 340 is disposed on the light emitting structure 335, and the outer side of the insulating layer 340 is exposed to the outside at the outer side of the light emitting structure 335.

The insulating layer 340 may isolate the light emitting structure 335 from the second electrode layer 350 or the conductive support member 360.

The insulating layer 340 may be formed in a closed loop having a ring, loop, or frame shape.

The insulating layer 340 may be formed of a material having permeability and/or insulating property, for example, one of $SiO_2$, $Si_3N_4$, $Al_2O_3$, $TiO_2$, and $SiO_x$. Because a laser is transmitted through the insulating layer 340 upon scribing of the laser, fragmentation of metallic material due to the laser can be prevented. Accordingly, a short circuit between layers on the side wall of the light emitting structure 335 can be prevented.

A groove 332 is formed on the outer side of the light emitting structure 335. The groove 332 has a certain depth extending from the second conductive semiconductor layer 330 to the first conductive semiconductor layer 310 to expose a portion of the first conductive semiconductor layer 310. The groove 332 is formed along the circumference of the light emitting structure 335. A protrusion 341 of the insulating layer 340 is formed in the groove 332. The protrusion 341 divides the light emitting structure 335 into an active region A1 and an inactive region A2.

The protrusion 341 of the insulating layer 340 is formed along the groove 332. The protrusion 341 is formed in a closed loop having a ring shape along the circumference of the light emitting structure 335.

A metal loop 345 may be formed on the first conductive semiconductor layer 310 exposed in the groove 332. When the exposed first conductive semiconductor layer 310 is, for example, a GaN-based semiconductor layer, Ga face region may be relatively much more exposed. The undersurface of the metal loop 345 contacts the first conductive semiconductor layer 310.

The metal loop 345 is formed on the first conductive semiconductor layer 310 along the groove 332. The metal loop 345 may be in a straight line or curved line having a regular or irregular width, but is not limited thereto. The metal loop 345 is spaced from the active layer 320 and/or the second conductive semiconductor layer 330.

The metal loop 345 contacts the protrusion 341 of the insulating layer 340. Here, the metal loop 345 is enclosed with the protrusion 341 and the branched ends 343 thereof to prevent a contact between the metal loop 345 and the active layer 320.

The metal loop 345 may be formed of a metal material such as Cr, Ni, Ti, Al, and an alloy thereof. The metal loop 345 is disposed on the Ga face region of the first conductive semiconductor layer 310 to perform a current spreading.

The conductive support member 360 may be formed on the second electrode layer 350. The structure and material of the conductive support member 360 will be those described in the first embodiment.

When a forward current is applied to the first electrode 315 and the conductive support member 360 of the semiconductor light emitting device 300, the current applied to the conductive support member 360 is uniformly distributed into the entire bottom surface, and the current supplied to the first electrode 315 flows in a vertical direction. In this case, a portion of the current injected into the first conductive semiconductor layer 310 through the first electrode 315 is spread in a horizontal direction.

The metal loop 345 may disperse a current flowing into the active layer 320 outwardly with respect to the center of the first electrode 315 because the metal loop 345 contacts the circumference of the first conductive semiconductor layer 310.

The current supplied from the first conductive semiconductor layer 310 to the active layer 320 may be uniformly applied. The current spreading in the first conductive semiconductor layer 310 may prevent a current from being concentrated, thereby improving internal quantum efficiency and reliability of the chip.

FIGS. 25 to 34 are views illustrating a process of manufacturing the semiconductor light emitting device in FIG. 24.

Figure 25:
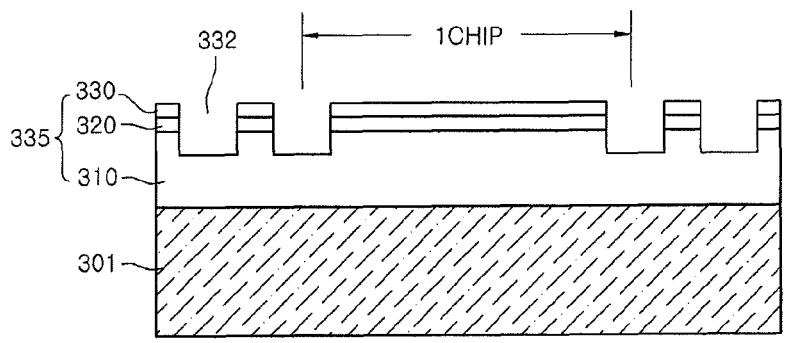
FIGS. 25 to 34 are views illustrating a process of manufacturing a semiconductor light emitting device in FIG. 24.

Referring to FIG. 25, a first conductive semiconductor layer 310 is formed on a substrate 301. A first conductive semiconductor layer 310 is formed on the substrate 301. An active layer 320 is formed on the first conductive semiconductor layer 310. A second conductive semiconductor layer 330 is formed on the active layer 320.

Hereinafter, detailed descriptions of the substrate 301, the first conductive semiconductor layer 310, the active layer 320, and the second conductive semiconductor layer 330 will be omitted by referring to the first embodiment.

The first conductive semiconductor layer 310, the active layer 320, and the second conductive semiconductor layer may be defined as a light emitting structure 335. The light emitting structure 335 may comprise at least one of an N-P junction, a P-N junction, an N-P-N junction, and P-N-P junction structures.

A groove 332 is formed in a chip boundary region of the light emitting structure 335. The groove 332 may be formed in a loop or frame shape along the outer side of the light emitting structure 335, and may be formed to have such a depth as to expose a portion of the first conductive semiconductor layer 310.

When the exposed first conductive semiconductor layer 310 is a GaN-based semiconductor, more of a Ga face region is exposed than an N face region, but the embodiment is not limited thereto.

Figure 26:
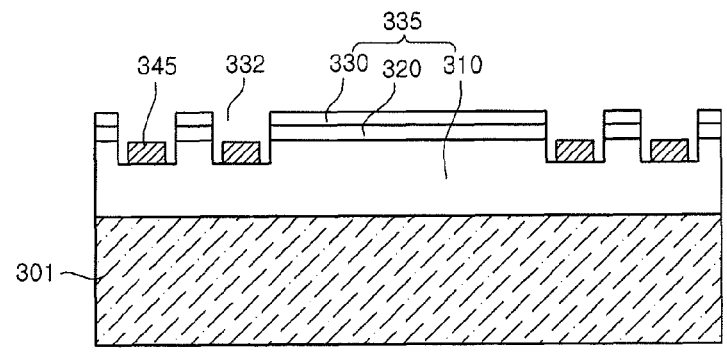
Figure 27:
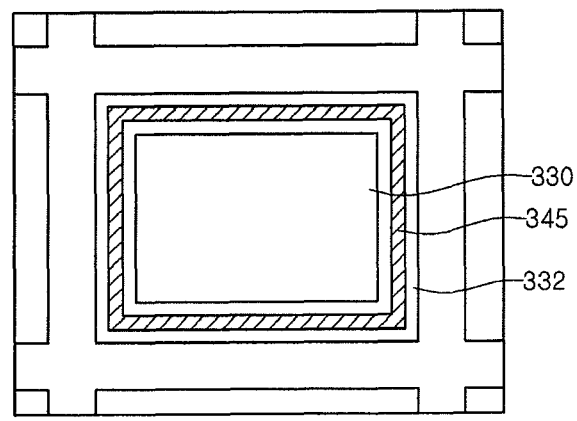

Referring to FIGS. 26 and 27, a metal loop 345 is formed in the groove 332 formed on the light emitting structure 335. The metal loop 345 contacts the exposed first conductive semiconductor layer 310. The metal loop 345 may be formed of a metal material such as Cr, Ni, Ti, Al, and an alloy thereof.

The metal loop 345 is formed to have a width smaller than that of the groove 332. The metal loop 345 is spaced from the active layer 320, and the second conductive semiconductor layer 330.

Figure 28:
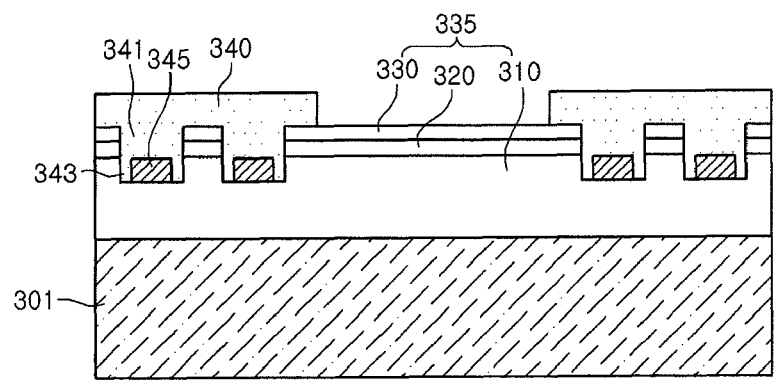

Referring to FIGS. 26 and 28, an insulating layer 340 is formed along the circumference of the light emitting structure 335 in an individual chip. A protrusion 341 of the insulating layer 340 is formed in the groove 332 disposed at the outer side of the light emitting structure 335. The protrusion 341 and both ends 343 of the insulating layer 340 enclose the metal loop 345 to protect from contacting other semiconductor layers (for example, active layer 320).

The insulating layer 340 may be formed of a material having permeability and/or insulating property, for example, one of $SiO_2$, $Si_3N_4$, $Al_2O_3$, $TiO_2$, and $SiO_x$. Because a laser is transmitted through the insulating layer 340 upon scribing of the laser, fragmentation of metallic material due to the laser can be prevented. Accordingly, a short circuit between layers on the side wall of the light emitting structure 335 can be prevented.

Figure 29:
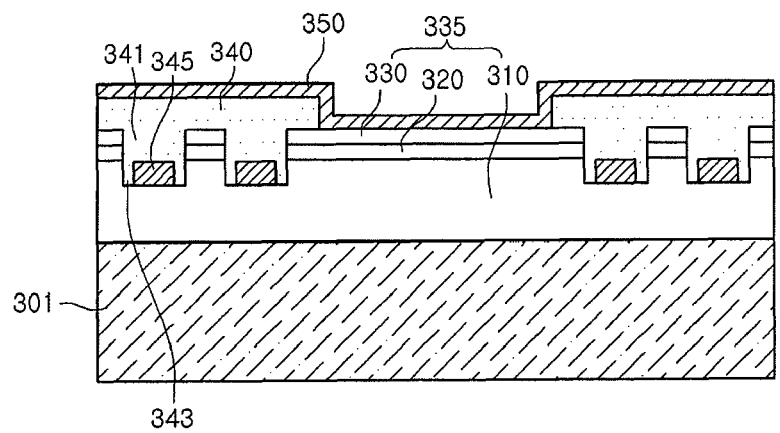
Figure 30:
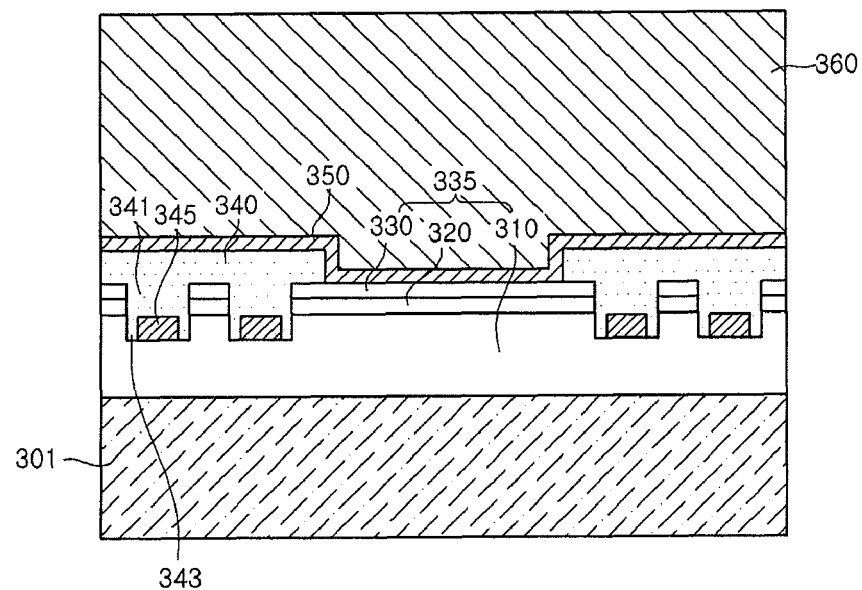

Referring to FIGS. 29 and 30, a second electrode layer 350 is formed on the second conductive semiconductor layer 330 and the insulating layer 340. A conductive support member 360 is formed on the second electrode layer 350. The material and the structure of the second electrode layer 350 and the conductive support member 360 will be those described in the first embodiment.

Figure 31:
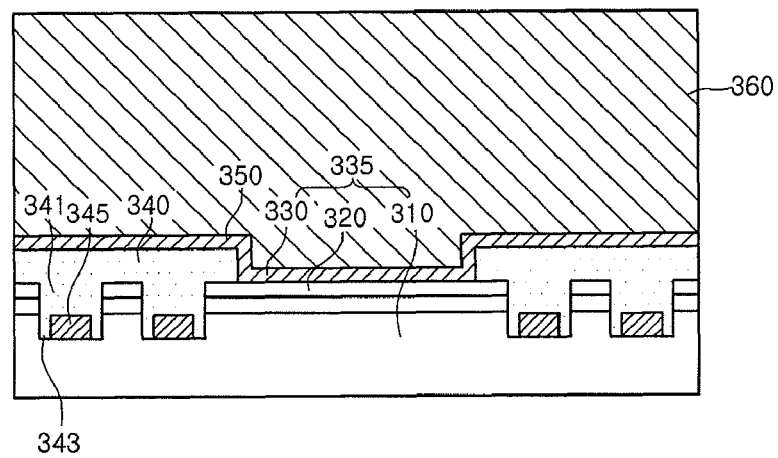

Referring to FIGS. 30 and 31, when the conductive support member 360 is formed, the substrate 301 is removed through a physical and/or chemical removal method. The substrate 301 may be removed by an LLP process, or a wet etchant, but is not limited thereto.

Figure 32:
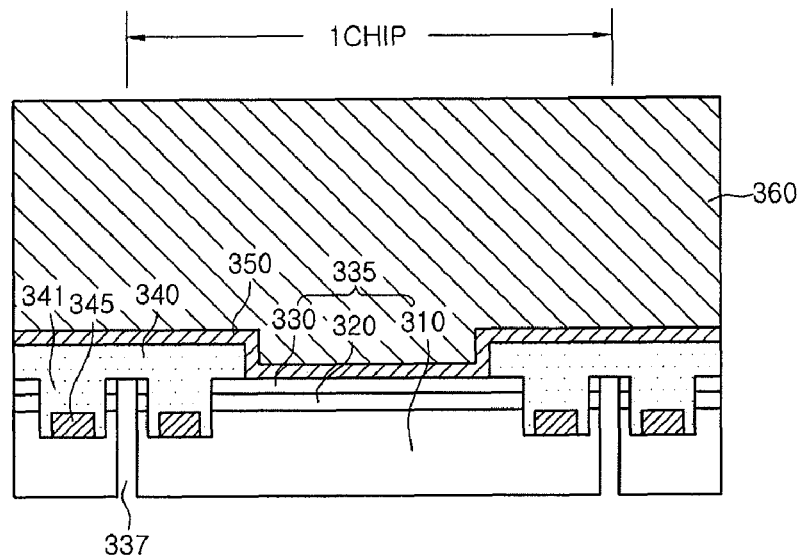

Referring to FIGS. 31 and 32, etching (for example, mesa etching) is performed on a chip and a chip boundary region (i.e., channel region) until the insulating layer 340 is exposed. The chip boundary region of the light emitting structure 335 is removed to form a chip separation groove 337. A first electrode 315 having a certain pattern is formed on the undersurface of the first conductive semiconductor layer 310. The first electrode 315 is formed at the center of the chip. In this case, the first electrode 315 may disperse a current through the metal loop 345. Accordingly, other patterns may not be required.

Figure 33:
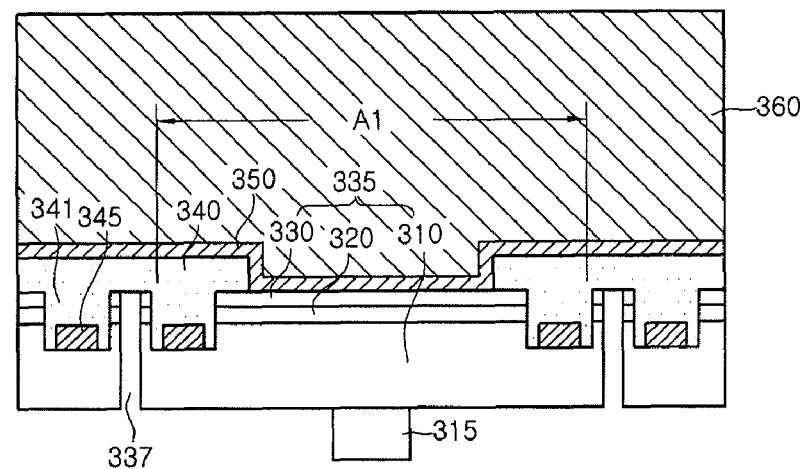
Figure 34:
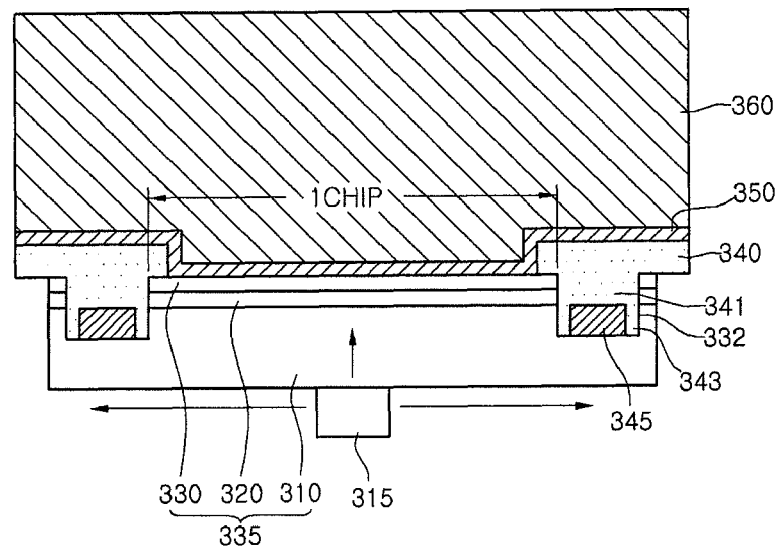

Referring to FIGS. 33 and 34, the semiconductor light emitting device 300 is divided into individual chips. Here, the formation process of the first electrode 370 may be performed before/after the mesa etching, or after the chip division, but is not limited thereto.

When a forward current is applied to the first electrode 315 and the conductive support member 360 of the semiconductor light emitting device 300, the current applied to the conductive support member 360 is uniformly supplied throughout the entire bottom surface. The current through the first electrode 315 can improve vertical current flow by the metal loop 345.

An active region A1 of the light emitting structure 335 is electrically driven. A portion of current injected into the first conductive semiconductor layer 310 through the first electrode 315 is horizontally spread by the metal loop 345.

Because the metal loop 345 is formed in a ring pattern along the circumference of the first conductive semiconductor layer 310, a portion of current injected into the first electrode 315 may be outwardly induced in a horizontal direction.

A current supplied from the first conductive semiconductor layer 310 to the active layer 320 may be uniformly applied. The current spreading in the first conductive semiconductor layer 310 may prevent a current from being concentrated, thereby improving internal quantum efficiency and reliability of the chip.

Figure 35:
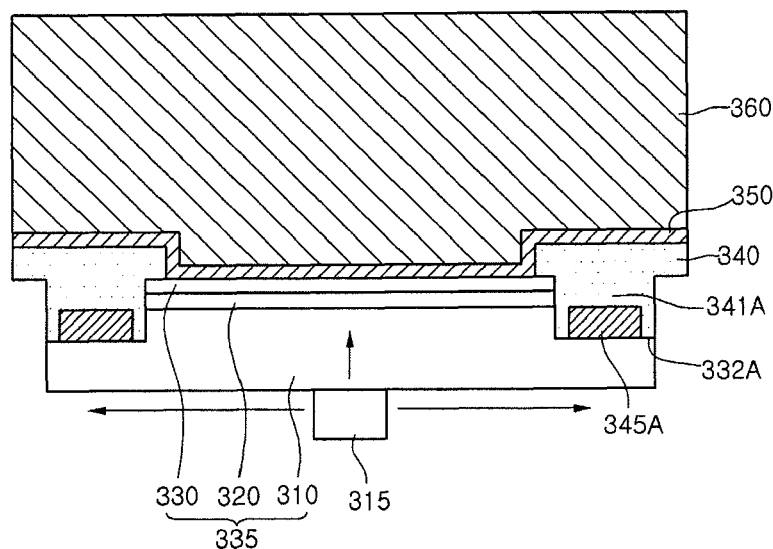
FIG. 35 is a cross-sectional view illustrating a semiconductor light emitting device according to a sixth embodiment.

FIG. 35 is a cross-sectional view illustrating a semiconductor light emitting device according to a sixth embodiment. Hereinafter, detailed descriptions of parts identical to those of the fifth embodiment will be omitted by referring to the fifth embodiment.

Referring to FIG. 35, a semiconductor light emitting device 300A has a structure comprising a groove 332A and a protrusion 341A of an insulating layer 341, which are disposed on the outer wall of a light emitting structure 335. The structure may enhance an area of an active layer 320 compared to the fifth embodiment.

Accordingly, the protrusion 341A of the insulating layer 340 is exposed to the outer end of the light emitting structure 335. Here, the width of the protrusion 341A of the insulating layer may be increased. Accordingly, the width of a metal loop 345A may also be increased.

Because the protrusion 341A of the insulating layer 340 is disposed at the outer end of the light emitting structure 335, the side wall of the light emitting structure 335 can be protected from humidity, and current spreading can be induced by the metal loop 345A.

Figure 36:
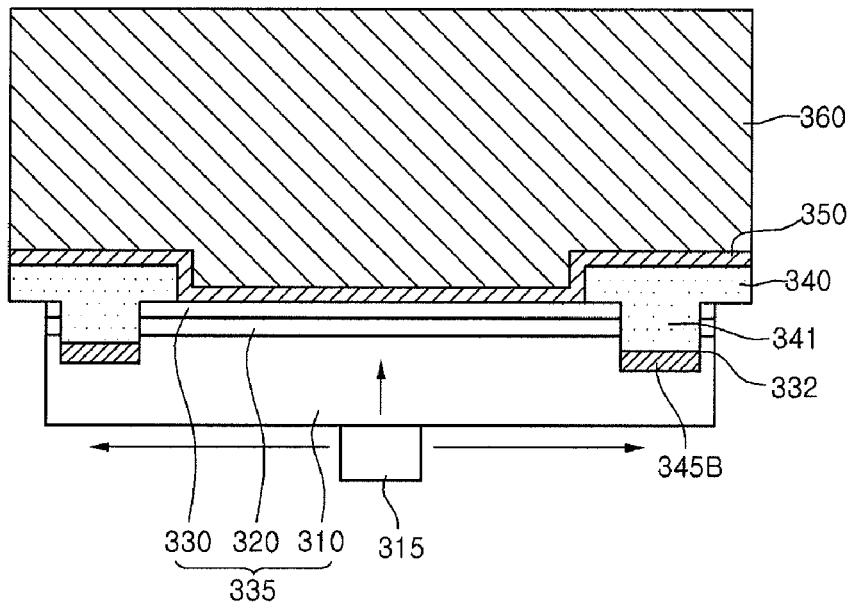
FIG. 36 is a cross-sectional view illustrating a semiconductor light emitting device according to a seventh embodiment.

FIG. 36 is a cross-sectional view illustrating a semiconductor light emitting device according to a seventh embodiment.

Referring to FIG. 36, a semiconductor light emitting device 300B has a structure of thinning the thickness of the metal loop 345B, or deepening the depth of a groove 332. In this case, the metal loop 345B may be formed in a width identical to that of the groove 332. Accordingly, both side surfaces of the metal loop 345B contact a first conductive semiconductor layer 310 exposed in the groove 332. Here, the groove 332 may be formed to have such a depth that the metal loop 345B may not contact an active layer 320.

A protrusion 341 of an insulating layer 340 is disposed in the groove 340. The protrusion 341 is disposed on the metal loop 345B. Because the undersurface and the side surface of the metal loop 345B contact the first conductive semiconductor layer 310, an electrical contact area is increased, thereby improving current spreading.

Figure 37:
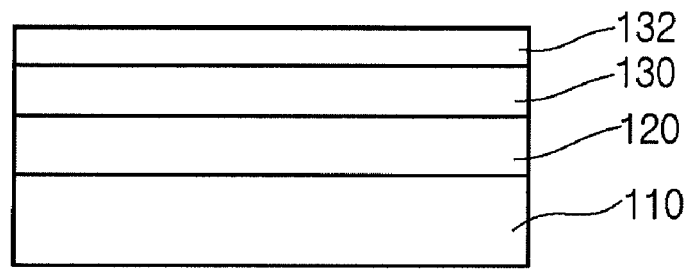
FIG. 37 is a view illustrating another exemplary of a light emitting structure according to an embodiment.

FIG. 37 is a view illustrating another exemplary of a light emitting structure according to a embodiment.

Referring to FIG. 37, One or more of the above-described embodiments includes the compound semiconductors of group III-V elements, which may comprise, for example, GaN, AlN, AlGaN, InGaN, InN, InAlGaN, AlInN, AlGaAs, GaP, GaAs, GaAsP and AlGaInP.

a light emitting structure 135A may comprises a first conductive semiconductor layer 110, a active layer 120, a second conductive semiconductor layer 130, and a third conductive semiconductor layer 132.

When the first conductive semiconductor layer 110 and the third conductive semiconductor layer 132 are a N-type semiconductor, the second conductive semiconductor layer 130 is a P-type semiconductor. When the first conductive semiconductor layer 110 and the third conductive semiconductor layer 132 are a P-type semiconductor, the second conductive semiconductor layer 130 is a N-type semiconductor. In the light emitting structure 135A may comprise one of an N-P-N junction, and a P-N-P junction structure.

One or more of the above-described embodiments can provide a moisture-resistant LED.

One or more of the above-described embodiments can enhance an adhesive strength between a semiconductor layer and an electrode layer by forming an insulating layer along the circumference of a light emitting structure and in a groove.

One or more of the above-described embodiments need not form an insulating on the entire outer wall of a light emitting structure.

One or more of the above-described embodiments can improve electrical reliability by disposing an inactive region at the outer side of a light emitting structure.

One or more of the above-described embodiments can improve external quantum efficiency through a reflecting layer on the outer wall of a light emitting structure.

One or more of the above-described embodiments can improve current distribution by disposing a metal loop around the circumference of a light emitting structure.

One or more of the above-described embodiments can improve reliability of a light emitting device.

Although various embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a conductive support member;
a light emitting structure under the conductive support member, wherein the light emitting structure comprises a second conductive semiconductor layer, an active layer under the second conductive semiconductor layer, and a first conductive semiconductor layer under the active layer;

an electrode layer having a first portion on the light emitting structure, the first portion of the electrode layer disposed between the conductive support member and the light emitting structure; and
an insulating layer along a circumference of a top surface of the light emitting structure and under a second portion of the electrode layer, the second portion of the electrode layer disposed between the conductive support member and the insulating layer,
wherein the insulating layer includes a protrusion protruding from an undersurface of the insulating layer through the second conductive semiconductor layer and the active layer into an upper part of the first conductive semiconductor layer.

2. The semiconductor light emitting device according to claim 1, wherein the protrusion is configured to divide the active layer into an active region circumscribed by and electrically isolated from an inactive region.

3. The semiconductor light emitting device according to claim 1, wherein the protrusion circumscribes an upper part of the light emitting structure.

4. The semiconductor light emitting device according to claim 2, wherein the protrusion comprises plural protrusions.

5. The semiconductor light emitting device according to claim 1, wherein the second portion of the electrode layer is electrically isolated from a semiconductor layer of the light emitting structure located at an outer side of the protrusion.

6. The semiconductor light emitting device according to claim 2, wherein a first portion of the second conductive semiconductor layer and a first portion of the active layer are located at an inner side of the protrusion and are electrically isolated from a second portion of the second conductive layer and a second portion of the active layer located at an outer side of the protrusion.

7. The semiconductor light emitting device according to claim 2, further comprising at least one of:
a reflecting layer on at least one outer wall of the light emitting structure; and
a metal loop embedded in a lower surface of the protrusion and in contact with the first conductive semiconductor layer.

8. The semiconductor light emitting device according to claim 1, wherein the light emitting structure comprises:
an N-type semiconductor layer or a P-type semiconductor layer on the second conductive semiconductor layer.

9. The semiconductor light emitting device according to claim 1, wherein the insulating layer and the protrusion are formed as a closed loop having a circular or polygonal shape.

10. A semiconductor light emitting device, comprising:
a light emitting structure comprising at least two conductive semiconductor layers and an active layer between the at least two conductive semiconductor layers;
a groove exposing one of the at least two conductive semiconductor layers under the active layer along a circumference of an upper part of the light emitting structure;
an insulating layer on an outer portion of the light emitting structure and having a protrusion disposed within the groove along a circumference of a top surface of the light emitting structure;
an electrode layer on the light emitting structure and the insulating layer; and
a conductive support member on the electrode layer,
wherein a first portion of the electrode layer is disposed between the conductive support member and the light emitting structure, and
wherein a second portion of the electrode layer is disposed between the conductive support member and the insulating layer.

11. The semiconductor light emitting device according to claim 10, wherein the electrode layer comprises:
a reflecting electrode layer.

12. The semiconductor light emitting device according to claim 10, further comprising:
an ohmic contact layer having a layer or multiple pattern and located between the electrode layer and the light emitting structure.

13. The semiconductor light emitting device according to claim 10, further comprising at least one of:
a metal loop between the protrusion of the insulating layer in the groove and the semiconductor layer under the insulating layer; and
a reflecting layer on an outer wall of the light emitting structure.

14. The semiconductor light emitting device according to claim 10, wherein the protrusion of the insulating layer is formed singly or doubly within a distance of about 1 µm to about 5 µm from the outer wall of the light emitting structure.

15. The semiconductor light emitting device according to claim 10, wherein the protrusion of the insulating layer has a width from about 1 µm to about 10 µm and contacts a semiconductor layer of the light emitting structure that is located under the active layer.

16. A semiconductor light emitting device, comprising:
a conductive support member;
a light emitting structure comprising a plurality of compound semiconductor layers under the conductive support member;
an insulating layer comprising a protrusion disposed along an outer circumference of the light emitting structure;
an electrode layer having an outer portion on the insulating layer and an inner portion on an inner portion of a top surface of the light emitting structure; and
an electrode under the light emitting structure,
wherein the inner portion of the electrode layer is disposed between the conductive support member and the light emitting structure, and
wherein the outer portion of the electrode layer is disposed between the conductive support member and the insulating layer.

17. The semiconductor light emitting device according to claim 16, wherein the light emitting structure comprises:
an active layer comprising a compound semiconductor of group III-V elements;
an N-type semiconductor layer under the active layer; and
a P-type semiconductor layer above the active layer.

18. The semiconductor light emitting device according to claim 16, comprising at least one of:
a reflecting layer on an outer wall of the light emitting structure; and
a metal loop between the protrusion and the N-type semiconductor layer.

19. The semiconductor light emitting device according to claim 16, wherein the insulating layer circumscribes an outer wall of the light emitting structure so that the outer wall of the light emitting structure is not exposed.

20. The semiconductor light emitting device according to claim 1, wherein a side surface of the insulating layer is in contact with a side surface of the electrode layer, and
wherein a top surface of the insulating layer is in contact with the electrode layer.

* * * * *